United States Patent
Amin et al.

(10) Patent No.: US 8,203,870 B2
(45) Date of Patent: Jun. 19, 2012

(54) FLUX PROGRAMMED MULTI-BIT MAGNETIC MEMORY

(75) Inventors: Nurul Amin, Woodbury, MN (US); Dimitar V. Dimitrov, Edina, MN (US); Haiwen Xi, San Jose, CA (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 30 days.

(21) Appl. No.: 12/953,205

(22) Filed: Nov. 23, 2010

(65) Prior Publication Data

US 2012/0127786 A1     May 24, 2012

(51) Int. Cl.
*G11C 11/00* (2006.01)
(52) U.S. Cl. ........ 365/158; 365/148; 365/171; 365/172; 977/935
(58) Field of Classification Search .......... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 5,801,980 A | 9/1998 | Wong et al. | |
| 5,930,164 A | 7/1999 | Zhu | |
| 6,542,343 B1 * | 4/2003 | Gill | 360/324.2 |
| 6,590,806 B1 | 7/2003 | Bhattacharyya | |
| 6,757,189 B2 | 6/2004 | Hung et al. | |
| 6,924,520 B2 * | 8/2005 | Park et al. | 257/295 |
| 6,947,312 B2 * | 9/2005 | Nakajima | 365/158 |
| 6,985,385 B2 | 1/2006 | Nguyen et al. | |
| 7,301,800 B2 | 11/2007 | Frey | |
| 2004/0165453 A1 * | 8/2004 | Nakajima | 365/200 |

* cited by examiner

*Primary Examiner* — Richard Elms
*Assistant Examiner* — Harry W Byrne
(74) *Attorney, Agent, or Firm* — Hall Estill Attorneys at Law

(57) ABSTRACT

An apparatus and associated method for a non-volatile memory cell, such as a multi-bit magnetic random access memory cell. In accordance with various embodiments, a first magnetic tunnel junction (MTJ) is adjacent to a second MTJ having a magnetic filter. The first MTJ is programmed to a first logical state with a first magnetic flux while the magnetic filter absorbs the first magnetic flux to prevent the second MTJ from being programmed.

20 Claims, 4 Drawing Sheets

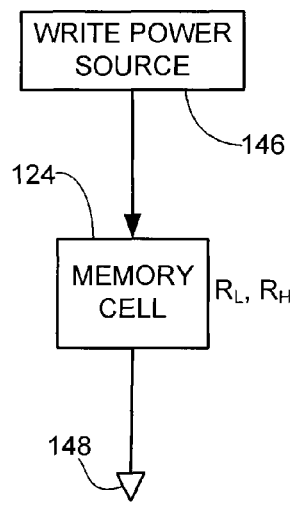
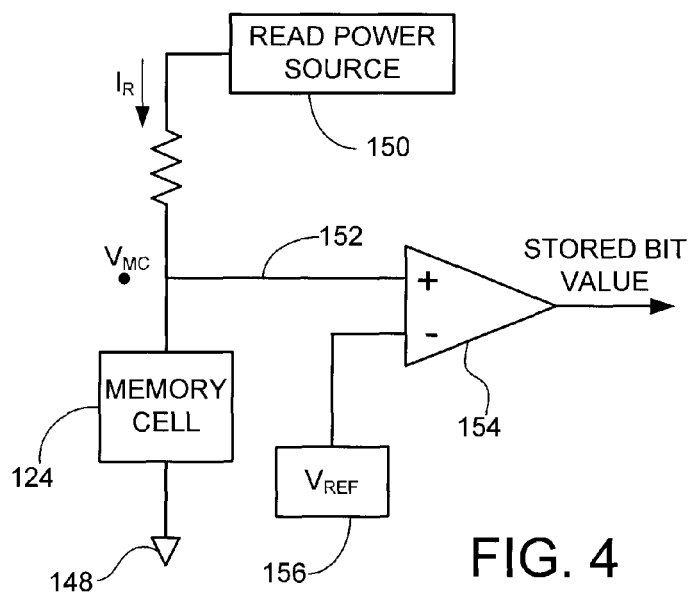
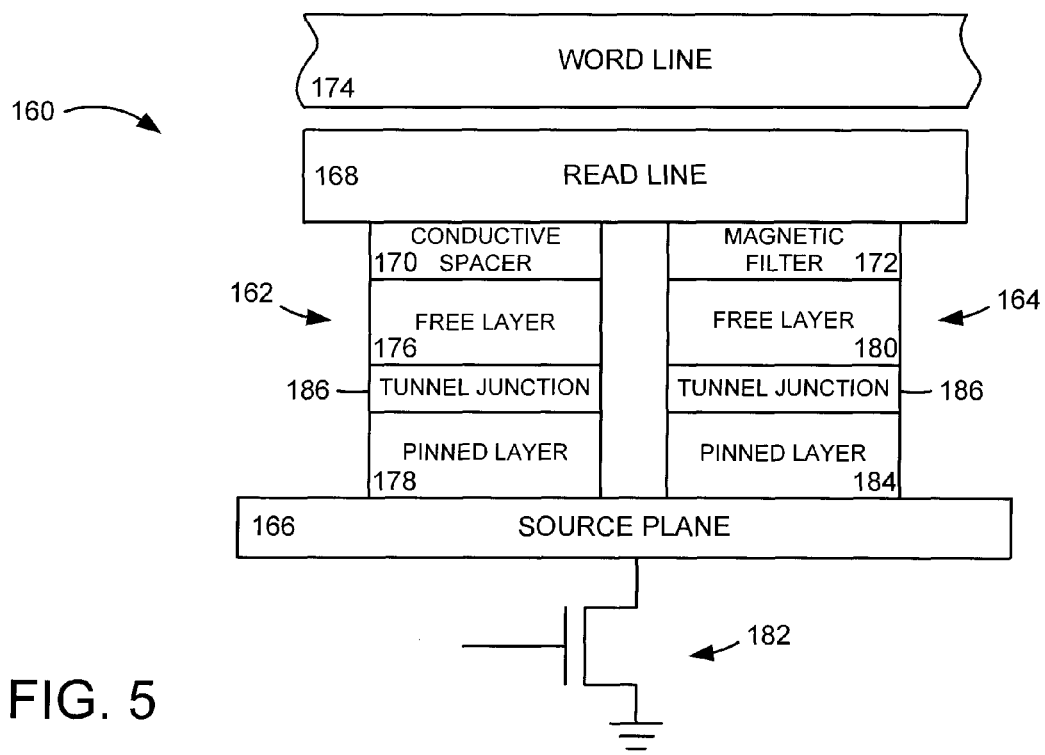

FLUX PROGRAMMED MULTI-BIT MAGNETIC MEMORY

SUMMARY

Various embodiments of the present invention are generally directed to a multi-bit non-volatile memory cell configured to be programmed with a magnetic flux.

In accordance with various embodiments, a first magnetic tunnel junction (MTJ) is adjacent to a second MTJ that has a magnetic filter. The first MTJ is programmed to a first logical state with a first magnetic flux while the magnetic filter absorbs the first magnetic flux to prevent the second MTJ from being programmed.

These and other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data can be written to a memory cell of the memory array.

FIG. 4 generally illustrates a manner in which data can be read from the memory cell of FIG. 3.

FIG. 5 shows an exemplary memory cell constructed and operated in accordance with the various embodiments of the present invention.

DETAILED DESCRIPTION

The present disclosure generally relates to multi-bit non-volatile magnetic memory cells. Solid state non-volatile memory is a developing technology aimed at providing reliable data storage and faster data transfer rates in ever decreasing form factors. However, such solid state memory can have limited practical applications due to low cell density and large programming requirements. As data storage devices decrease in size, the large programming requirements can result in high volatility for adjacent cells, which corresponds with reduced memory cell readability and writeability.

Accordingly, a memory cell with a first magnetic tunnel junction (MTJ) adjacent to a second MTJ that has a magnetic filter provides increased cell density in combination with decreased programming requirements. By passing a magnetic flux below a threshold value, a first MTJ can be programmed to a logical state while the magnetic filter of the second MTJ absorbs the first magnetic flux to prevent the second MTJ from being programmed. In contrast, passage of a magnetic flux above the threshold value programs both MTJs to a logical state due to the magnetic filter becoming magnetically saturated in the presence of ample magnetic flux. As such, multiple bits and increased memory capacity is achieved due to the ability to selectively program one or both MTJs.

Figure 1:
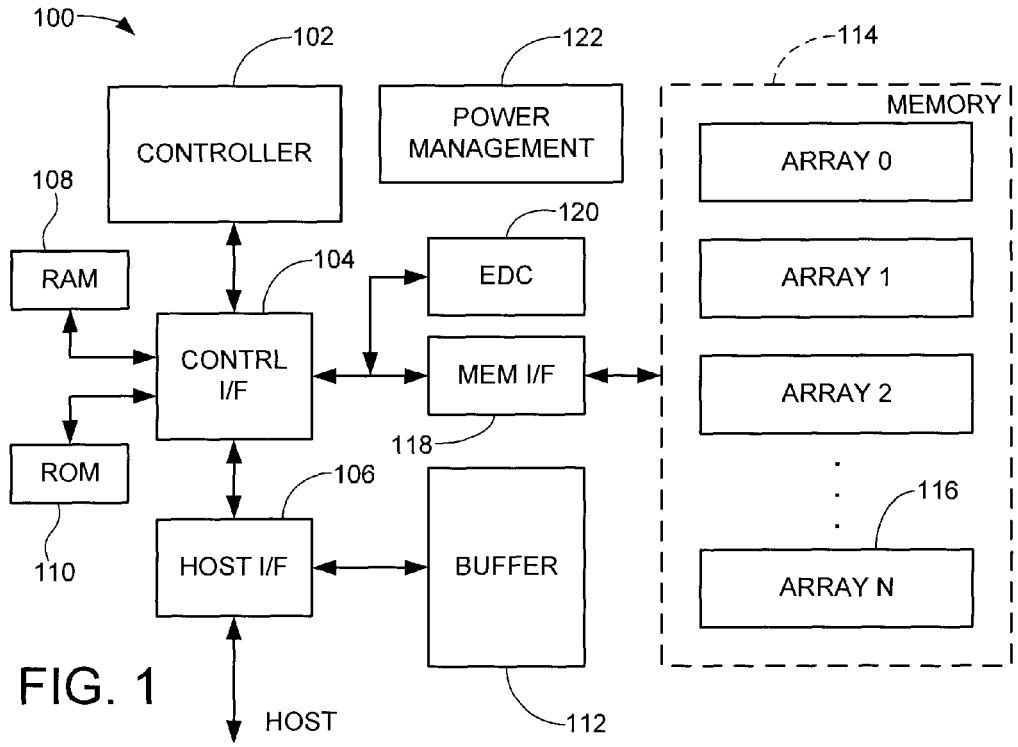
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of magnetic (MRAM) semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
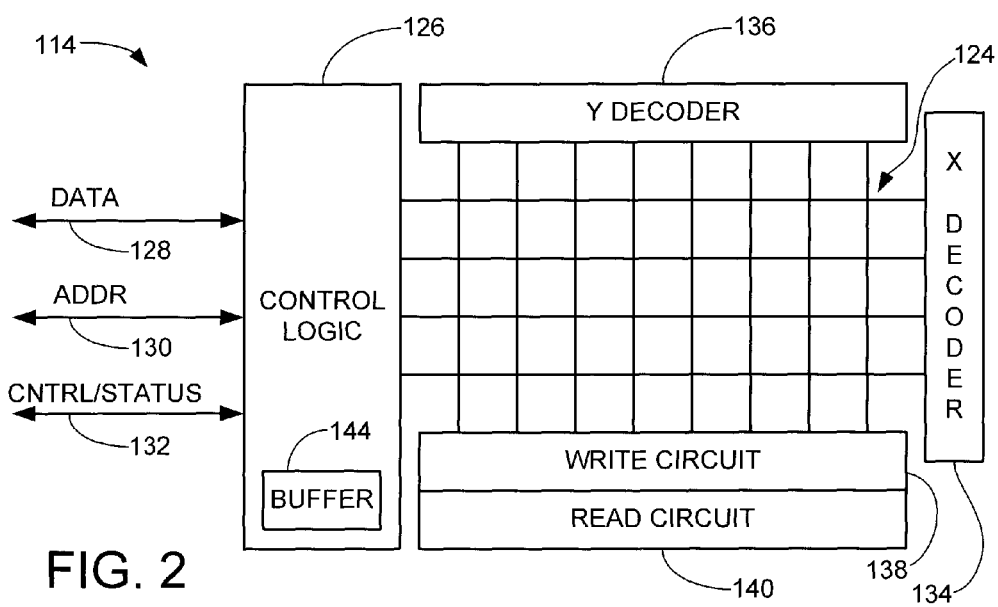
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines. The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified magnetic random access memory (MRAM) configuration, in which case the write power source 146 is characterized as a current driver connected through a memory cell 124 to a suitable reference node 148, such as ground. The write power source 146 provides an electric current trough a word line passing in the vicinity of the MRAM cell. The magnetic flux from the word line creates a magnetic field which changes the orientation of the magnetic moment of the memory cell 124.

Depending on the direction of the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100K$\Omega$ or so. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator (sense amplifier) 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 5 generally illustrates a non-volatile memory cell 160 in accordance with various embodiments of the present invention. A first magnetic tunnel junction (MTJ) 162 is positioned adjacent a second MTJ 164 on a source plane 166. The first and second MTJs 162 and 164 are attached to a read line 168 by a magnetically conductive spacer layer 170 and magnetic filter 172, respectively. The conductive spacer layer 170 is configured to allow magnetic flux corresponding to a current passing through a word line 174 to program a ferromagnetic free layer 176 of the first MTJ 162 with a predetermined logical state.

In operation, current with a predetermined value and direction passing through the word line 174 produces a magnetic flux that sets the magnetization direction of the free layer 176, which can be read as a logical state with respect to a magnetically pinned layer 178. If that current is below a predetermined threshold value, the magnetic filter 172 absorbs the magnetic flux and shields a magnetic free layer 180 of the second MTJ 164 and prevents any programming. Otherwise, a current above the predetermined threshold value saturates the magnetic filter 172 and transforms it from a magnetically insulative material to a conductive material that allows the magnetic flux to penetrate the free layer 180 and program a logical state.

The construction of the memory cell 160 with adjacent MTJs 162 and 164 shown in FIG. 5 allows for the selective programming of a logical state to one, or both, MTJs depending on the strength of the current passing through the word line 174. A programmed logical state can subsequently be read by passing a read current through the MTJs 162 and 164 from the read line 168 to the source plane 166 with the activation of a selection device 182, such as a transistor and/or diode. With both MTJs 162 and 164 attached to the same read line 168 and source plane 166, the read current can be interpreted through various manners to determine the logical state of each MTJ 162 and 164, simultaneously.

As can be appreciated, the pinned layer 178 and 184 of each respective MTJ 162 and 164 can be a single layer, such as an antiferromagnetic (AFM) material, lamination of layers, such as a synthetic antiferromagnetic structure, or combination of layers, such as an AFM coupled to a magnetic free layer, that maintains a preset magnetization in the presence of magnetic flux either above or below the predetermined threshold. Each MTJ 162 and 164 can be further configured with magnetoresistive tunnel junctions 186 separating the pinned and free layers 178 and 176.

While the memory cell 160 is not limited to the configuration shown in FIG. 5, the word line 174 extends, in some embodiments, along an axis that is perpendicular to the longitudinal axis of each MTJ 162 and 164. An example of the various configurations of the MTJs and directions of magnetic flux are further provided in FIG. 6 which displays an operational view of a portion of another exemplary memory cell 190. The cell 190 has dual MTJs 192 and 194 that each have a magnetic free layer 196 and pinned layer 198 separated by a tunnel junction 200 that allows a magnetoresitive effect. The MTJs 192 and 194 respectively are coupled to a source plane 202 on a bottom surface and a read line 204 on a top surface with a magnetically conductive spacer 206 and magnetic filter 208.

The passage of current below a predetermined value through the word line 210 generates a magnetic flux 212 that encircles the word line 210 and magnetically saturates the magnetic filter while setting a predetermined magnetization to the free layer 196 of the first MTJ 192. In some embodiments, the magnetic filter 208 is a soft magnetic material that exhibits low coercivity which allows the filter 208 to absorb the magnetic flux 212 to magnetic saturation while shielding the flux 212 from reaching the free layer 196 of the second MTJ 194.

Passage of a current above a predetermined value provides a magnetic flux 214 that saturates the magnetic filter 208 and sets a magnetization to the free layers 196 of both MTJs 192 and 194. As such, controlling the amount of current passing through the word line 210 can selectively program magnetizations, and corresponding logical states, to each of the MTJs 192 and 194, either individually or collectively. The ability to program a magnetization to one or both MTJs 192 and 194 allows for the efficient programming of multiple bits of data in a single memory cell.

Figure 6:
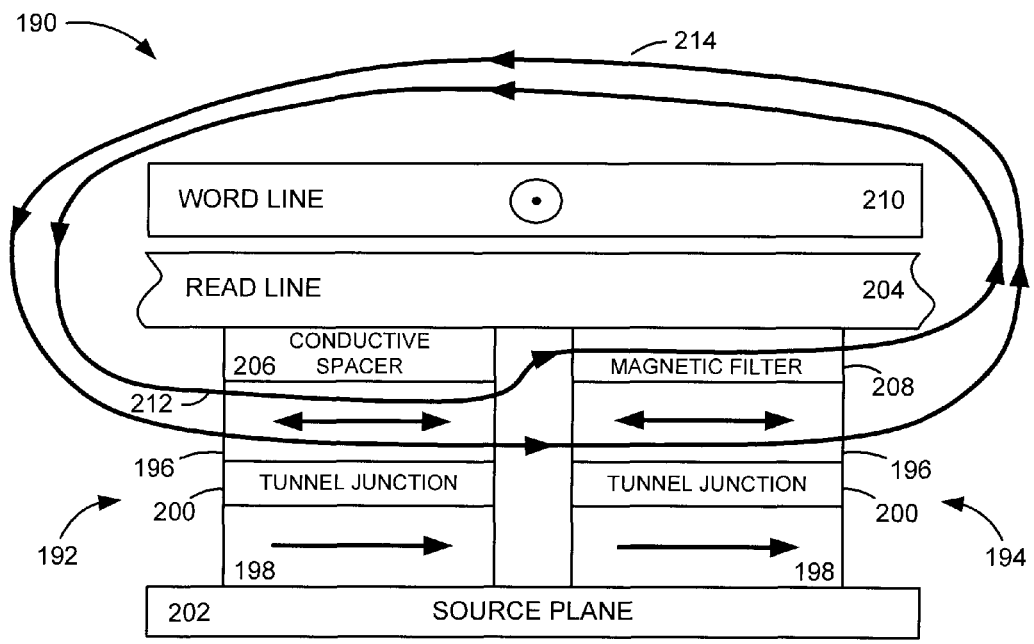
FIG. 6 displays an exemplary operational configuration of the memory cell of FIG. 5.

While FIG. 6 illustrates magnetic flux rotating about the word line 210 in a clockwise direction, such orientation is not limited as current can flow through the word line 210 in a counter-clockwise direction that will generate flux rotating in an opposite direction and set opposite magnetizations in the free layers 196 compared to the flux shown in FIG. 6. However, the physical orientations of the MTJs 192 and 194 can be modified to interact with the generated magnetic flux in various ways, as shown in FIG. 7.

Figure 7:
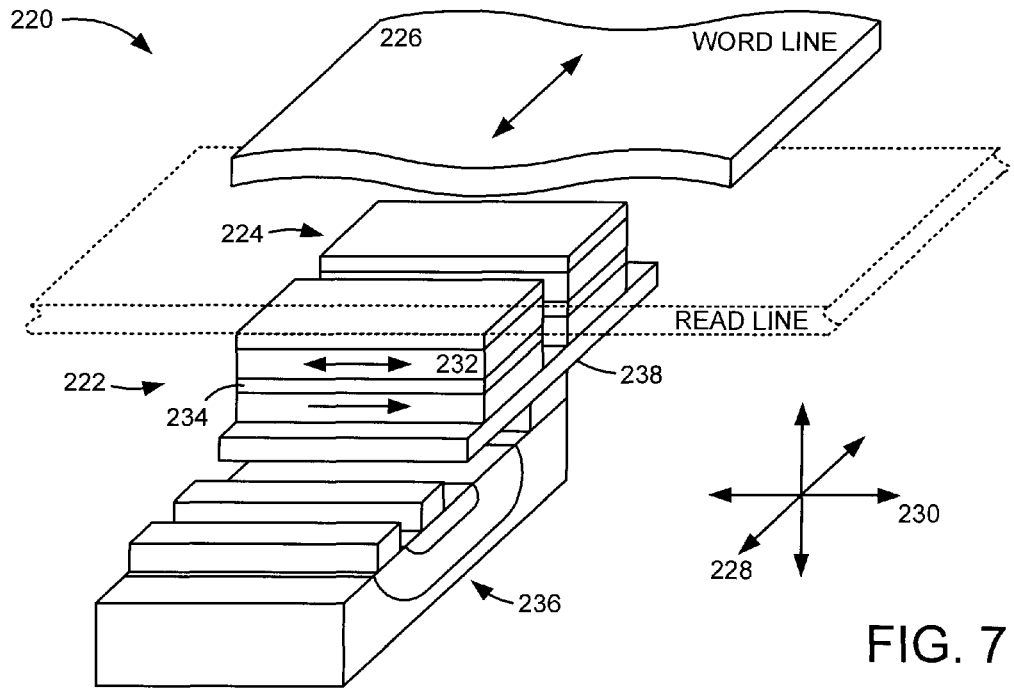
FIG. 7 illustrates an isometric representation of an exemplary memory cell constructed and operated in accordance with the various embodiments of the present invention.

FIG. 7 generally illustrates an isometric view of an exemplary memory cell 220 in which the first and second MTJs 222 and 224 extend along an axis perpendicular to the word line 226. That is, magnetic flux corresponding to current flowing through the word line 226 and word axis 228 passes parallel to the long axis 230 of each MTJ 222 and 224. The magnetic flux further contacts the free layers 232 of each MTJ for a longer time than f the MTJs 222 and 224 were 90° offset from the orientation shown in FIG. 7. By orienting the MTJs 222 and 224 where the long axis 230 is perpendicular to the word line 226, a maximum amount of magnetic flux is imparted onto the free layers 232 and programming efficiency is enhanced.

The configuration of the MTJs 222 and 224 can be modified to provide different coercivities and resistances that further enhance programming efficiency. The different operational characteristics can be achieved in a variety of manners, none of which are required or limited. One such manner is by adjusting the thickness of the tunnel junction 234 that separates the pinned and free layers of the MTJs 222 and 224. An increase in thickness of a tunnel junction can add resistance to the MTJ and introduce degeneracy between the magnetic bits of the cell 220.

Furthermore, the material of the tunnel junctions can also be modified to vary the operational behavior, such as changing the predetermined magnetic flux value of the MTJs, and allow for more efficient reading and programming. For example, the tunnel junction of the first MTJ 222 can be smaller than the tunnel junction of the second MTJ 224 to allow a reduced magnetic flux to program the first MTJ 222 alone. Such a reduction in required flux translates to a smaller current and programming with a lower amount of energy.

The cell 220 can further be adjusted to achieve various MTJ reading characteristics, such as faster reading times and lower required reading currents. A selection device 236 attached to the source plane 238 that joins the MTJs 222 and 224 can be configured to provide a multitude of adjustable parameters that affect the reading of the cell 220. The size of the selection device 236 including the selection voltage and overall current capacity can be adjusted, as desired, to tune the reading of the MTJs 222 and 224 to provide optimal performance.

Figure 8:
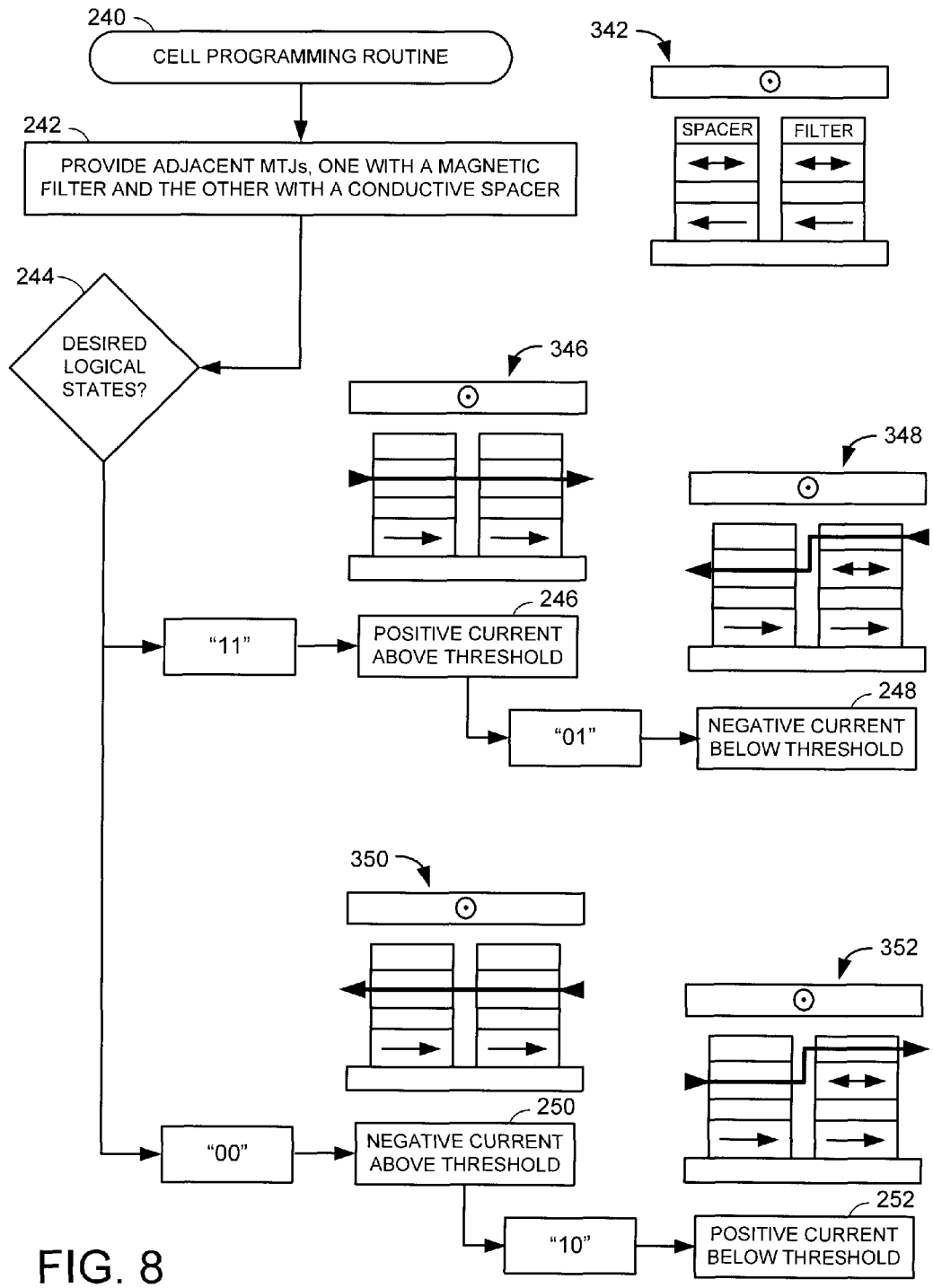
FIG. 8 displays a flow diagram and corresponding illustrative magnetic stacks of an exemplary CELL PROGRAMMING routine conducted in accordance with the various embodiments of the present invention.

A flow chart of an exemplary cell programming routine 240 capable of being used with the memory cells of FIGS. 5-7 is displayed in FIG. 8. The routine 240 begins by providing a memory cell with at least two adjacent MTJs, one of which has a magnetically conductive spacer layer and the other having a magnetic filter, as graphically illustrated by cell 342. As discussed above, the magnetic filter can be a soft magnetic material that absorbs flux to transform from magnetically insulative to magnetically conductive. The routine proceeds to decision 244 in which the desired logical states for the MTJs are determined.

While more than two MTJs can provide any number of programmable bits and resultant logical state combinations, two MTJs allow for four logical state combinations (01, 11, 10, and 00). A determination of a "11" or "01" logical state combination advances to step 246 where a positive current above a predetermined threshold value is passed through the word line, as displayed in cell 346. Such positive current in the word line generates a magnetic flux that is large enough to saturate the magnetic filter and program the free layers of both MTJs to a "1" logical state.

If a "11" combination was desired, the routine can return decision 244 with respect to another memory cell. Otherwise, the routine proceeds to step 248 where a negative current that is below the predetermined threshold value of the magnetic filter is passed through the word line to produce a magnetic flux that will be shielded from the free layer of the second MTJ by the magnetic filter. As can be appreciated, the use of "positive" and "negative" currents is strictly related to the direction of current flow through the word line and in no way requires that current have a negative value. As shown by cell 348, a negative current and the corresponding negative magnetic flux merely flows in an opposite direction in relation to a positive current and flux.

The routine 240 can advance to a different memory cell and begin again, or the same cell provided in step 242 can return to decision 244 to be reprogrammed to a different logical state combination after step 248. In the event that "00" or "10" are desired combinations, routine 240 advances from step 244 to step 250 where a negative current and corresponding magnetic flux are induced, as shown in cell 350, to program both MTJs to a 0 logical state. The further passage of a positive current below the predetermined threshold value is conducted in step 252 to program the first MTJ to a 1 logical state while the magnetic filter shields the second MTJ from the flux, as illustrated in cell 352.

It should be noted that the programming routine 240 is not limited to the steps and corresponding exemplary memory cells shown in FIG. 8. The various steps can be modified or omitted while new steps can be added, as desired. For example, decision 244 can be repeated an indefinite amount of times for the same memory cell as logical states are continually programmed and reprogrammed. In another exemplary modification, all the positive and negative current conventions can be flipped so that a negative current produces a logical state of 1 while a negative state programs a logical state of 0.

As can be appreciated by one skilled in the art, the various embodiments illustrated herein provide advantages in both memory cell programming and reading efficiency. The ability to concurrently read two bits in a memory cell consequently requires less reading current. Moreover, the ability to selectively program one of the bits allows less programming current while increasing data capacity. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A memory cell comprising a first magnetic tunnel junction (MTJ) adjacent a second MTJ having a magnetic filter, the first MTJ being programmed to a first logical state with a first magnetic flux while the magnetic filter absorbs the first magnetic flux to prevent the second MTJ from being programmed.

2. The memory cell of claim 1, wherein the absorption of the first magnetic flux saturates the magnetic filter and induces a transition from magnetically insulative to conductive.

3. The memory cell of claim 1, wherein the first and second MTJs are concurrently programmed by a second magnetic flux that is greater than a predetermined valued.

4. The memory cell of claim 3, wherein the first magnetic flux is below the predetermined value.

5. The memory cell of claim 1, wherein the magnetic flux is generated by current passing through a word line that is noncontactingly adjacent to the MTJs.

6. The memory cell of claim 5, wherein the first and second MTJs each extend along a long axis that is perpendicular to the flow of current along the word line.

7. The memory cell of claim 1, wherein the magnetic filter is a soft magnetic material that has a low coercivity.

8. The memory cell of claim 1, wherein the first and second MTJs are each coupled to a read line on a top surface and a source plane on a bottom surface.

9. The memory cell of claim 8, wherein the source plane is connected to a selection device that selectively allows reading of the first and second MTJs.

10. The memory cell of claim 1, wherein the first MTJ has a different resistance than the second MTJ.

11. The memory cell of claim 10, wherein the first MTJ has a greater resistance than the second MTJ due to a tunnel junction of the first MTJ having a greater thickness than a tunnel junction of the second MTJ.

12. A method comprising:
   providing a first magnetic tunnel junction (MTJ) adjacent a second MTJ having a magnetic filter; and
   programming a first logical state to the first MTJ with a first magnetic flux while the magnetic filter absorbs the first magnetic flux to prevent the second MTJ from being programmed.

13. The method of claim 12, wherein the magnetic flux is generated by a current flowing through a word line that is noncontactingly adjacent the first and second MTJs.

14. The method of claim 12, wherein the magnetic flux is less than a predetermined threshold value.

15. The method of claim 12, wherein a second magnetic flux greater than a predetermined threshold value saturates the magnetic filter and programs the first and second MTJs.

16. The method of claim 15, wherein the first magnetic flux flows in a first direction and the second magnetic flux flows in an opposite second direction.

17. The method of claim 15, wherein the first and second MTJs are programmed to opposite magnetizations with successive passage of the second then first magnetic fluxes.

18. The method of claim 12, wherein the first and second MTJs are coupled to a source plane that is connected to a selection device that selectively allows concurrent reading of the MTJs.

19. A memory cell comprising:
   a first magnetic tunnel junction (MTJ) having a magnetically conductive spacer adjacent a second MTJ having a magnetic filter, the conductive spacer and magnetic filter each attached to a top surface of each MTJ and a read line;
   a word line separated from the first and second MTJs by the read line, the first MTJ being programmed to a first logical state with a first magnetic flux generated by a first current below a predetermined value passing through the word line while the magnetic filter absorbs the first magnetic flux to prevent the second MTJ from being programmed.

20. The memory cell of claim 19, wherein the first and second MTJs are programmed to opposite logical states by passing a second current above the predetermined threshold value through the word line to generate a second magnetic flux that programs both MTJs then passing the first current through the word line.

* * * * *